United States Patent [19]

Mroczkowski et al.

[11] Patent Number: 4,924,096
[45] Date of Patent: May 8, 1990

[54] NON-CONTACT TESTING OF PHOTOVOLTAIC DETECTOR ARRAYS

[76] Inventors: Jacek A. Mroczkowski, 4 Frances Rd., Lexington, Mass. 02173; Marion B. Reine, 11 Cottage St., Wellesley, Mass. 02181; Neal R. Butler, 144 School St., Acton, Mass. 01720

[21] Appl. No.: 218,677

[22] Filed: Jul. 13, 1988

[51] Int. Cl.[5] .............................................. G01R 31/28
[52] U.S. Cl. .................................. 250/341; 250/338.1; 250/338.4; 324/158 R; 324/501
[58] Field of Search .................. 250/341, 338.4, 338.1; 324/158 D, 158 R, 501

[56] References Cited

U.S. PATENT DOCUMENTS

| | | | |
|---|---|---|---|
| 4,286,215 | 8/1981 | Miller | 324/158 R |
| 4,709,141 | 11/1987 | Olsen | 250/211 R |
| 4,712,057 | 12/1987 | Pau | 324/73 R |

OTHER PUBLICATIONS

Marek Mieszkowski, Kwan F. Leung and Andreas Mandelis, "Photopyroelectric Thermal Wave Detection via Contactless Capacitive Polyvinylidene Fluoride (PVDF)-Metal Probe-Tip Coupling", *Review of Scientific Instruments*, vol. 60, No. 3, (Mar. 1989), pp. 306–316.

P. R. Jay and H. C. Wright, "Photocapacity Analysis Using a Mercury Probe", *Journal of Physics E: Scientific Instruments*, vol. 14, No. 4, (Apr. 1981), pp. 408–409.

*Primary Examiner*—Constantine Hannaher
*Attorney, Agent, or Firm*—Lucas & Just

[57] ABSTRACT

The present method for non-contact testing of infrared photovoltaic detectors employs a probe which is positioned a distance "d" from a detector contact to form a capacitance between the probe and the detector. The probe signal is amplified by a preamplifier and the diode is excited both electrically, through the common contact, and optically with a known infrared signal. The probe position is controlled by measuring the probe to detector capacitance. Electrical and electro-optical detector parameters can be determined using standard AC circuit analysis techniques.

6 Claims, 1 Drawing Sheet

NON-CONTACT TESTING OF PHOTOVOLTAIC DETECTOR ARRAYS

BACKGROUND OF THE INVENTION

1. Field of the Invention

This invention relates generally to infrared photovoltaic detectors and more particularly to a method and system for the non-contact testing of large mosaic arrays of infrared photovoltaic detectors, especially those made of mercury cadmium telluride, by capacitively coupled measurements of (a) open circuit photovoltage and (b) current versus voltage characteristics. Photovoltaic detectors are photosensitive diodes, and are often referred to simply as "photodiodes".

2. Discussion of the Prior Art

Testing of large mosaic arrays of photovoltaic detectors has required physical contact with contacts or a probe to every detector. This means either that the array of detectors cannot be tested until after it is connected to the electronics with which it will be used or that removable test contacts have to be used. The first approach is very expensive, since both the detector array and the electronics, generally multiplexer, to which it is connected must be discarded if the array fails the test. The second method has been applied to date only for a few elements of large arrays. Both approaches have severe limitations which the present invention eliminates.

SUMMARY OF THE INVENTION

A non-contact method and system for testing infrared photovoltaic detectors by capacitively coupled measurements of open circuit photovoltage and current versus voltage characteristics is disclosed. This method and system is especially useful for infrared photovoltaic detectors fabricated from mercury cadmium telluride.

The method of the present invention involves positioning a probe a distance "d" from the individual contact of an infrared photovoltaic detector such that a coupling capacitor is formed between the probe and the individual contact of the infrared photovoltaic detector. A preamplifier is connected to the probe and the system's common ground. A known AC voltage source is applied to the common contact of the infrared photovoltaic detector array and a known level of modulated infrared illumination is incident on the individual infrared photovoltaic detector to be tested. Measurement of infrared photovoltaic detector properties, both electrical and optical, is possible with this method.

The system of the present invention includes:

(a) A probe having tip cross-sectional dimensions similar to the surface area of an individual contact of an infrared photovoltaic detector;

(b) A means for aligning the probe with the individual contact point of the infrared photovoltaic detector such that a capacitance is formed between the probe and the individual contact of the infrared photovoltaic detector;

(c) A preamplifier mounted in close proximity to the probe;

(d) A means for supplying modulated infrared illumination of known intensity to common contact of the infrared photovoltaic detector array;

(e) A means for applying a known AC voltage to the infrared photovoltaic detector;

(f) A means for analyzing the output signals from the preamplifier; and (g) A means for maintaining the infrared photovoltaic detector at the appropriate temperature.

Testing of photovoltaic detectors in accordance with the present invention involves measuring the photosensitivity of the device as well as its current versus voltage characteristics. The combination of these two sets of measurements is sufficient to determine whether or not the photovoltaic detector is functioning properly. The measurements which can be made with this system include: Probe capacitance (this measurement can be used to set the probe spacing to the desired value); photodiode capacitance; photodiode open circuit photovoltage; photodiode resistance (at zero bias); photodiode current-voltage characteristics; and photodiode excess noise (which is a variation with time of the current-voltage characteristics.) These measurements are performed by varying the amplitude and frequency of the AC voltage applied to the infrared photovoltaic detector and analyzing the preamplifier output for the varying conditions. Using standard methods well known to those of skill in the art, the different characteristics of the infrared photovoltaic detector are determined. These measurements are taken without having to make contact to individual elements of the detector array; only a single contact to the array substrate is required.

BRIEF DESCRIPTION OF THE DRAWINGS

For a more complete understanding of the invention, reference is hereby made to the drawings in which.

DESCRIPTION OF THE PREFERRED EMBODIMENT

Figure 1:
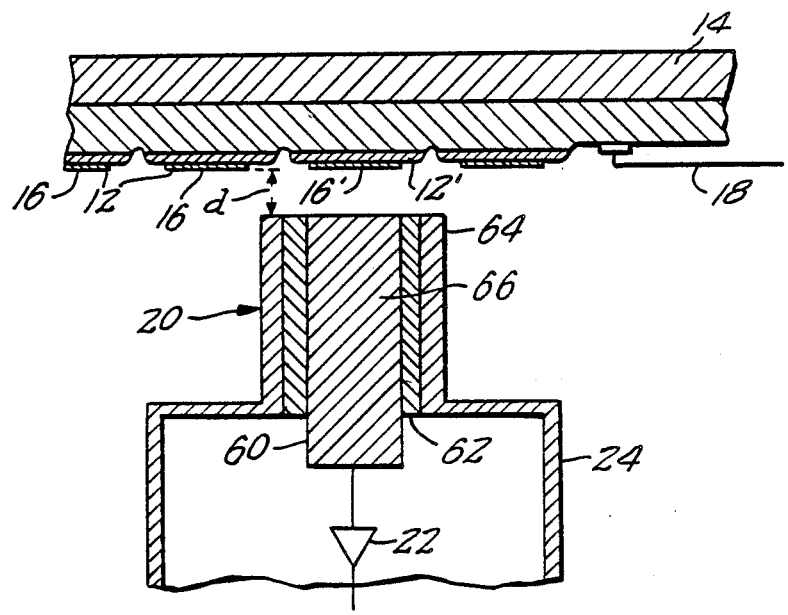
FIG. 1 illustrates a probe and spacing between the probe and the individual contact of the infrared photovoltaic detector in accordance with the present invention.

FIG. 1 illustrates a preferred embodiment of the probe and the spacing between the probe and the individual contact of the present invention. Individual infrared photovoltaic detectors 12 have been formed in an array configuration in a photosensitive substrate material 14, such as mercury cadmium telluride. Each infrared photovoltaic detector has an individual contact pad 16. Substrate 14 has common contact 18 for all the infrared photovoltaic detectors 12. Over the infrared photovoltaic detector to be tested 12', probe 20 has been positioned such that probe 20 and individual contact 16' are aligned. Located in close proximity to probe 20 is preamplifier 22. Surrounding both probe 20 and preamplifier 22 is electrical shield 24.

Figure 2:
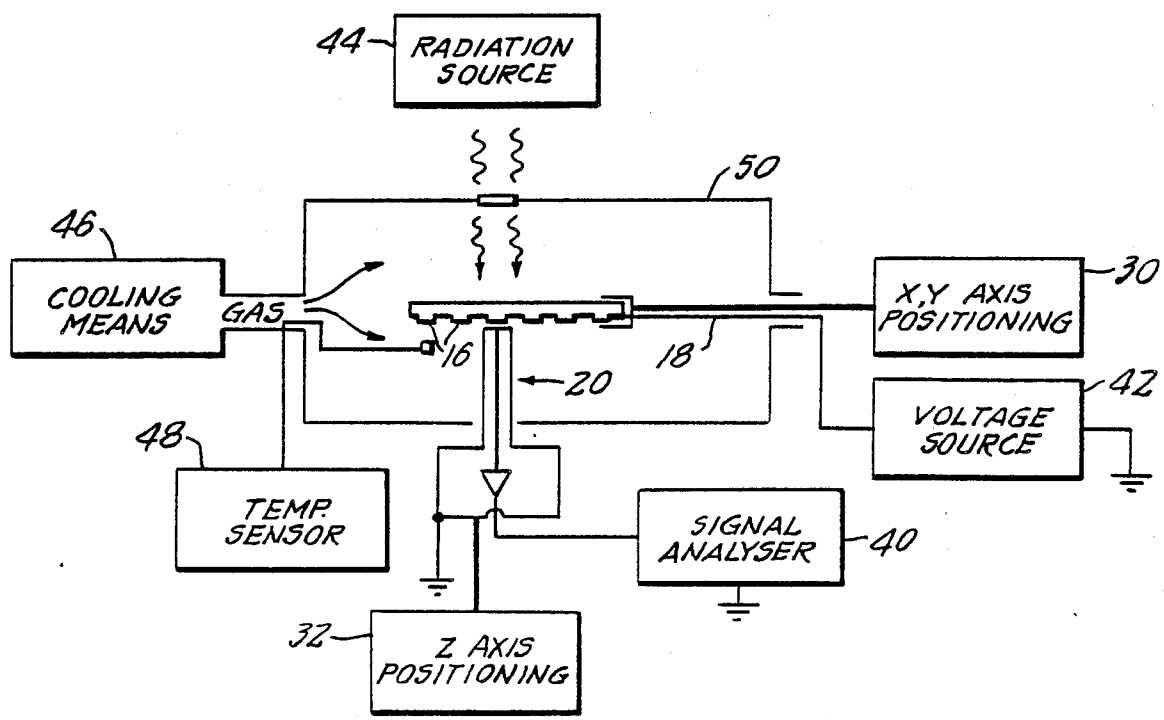
FIG. 2 is a schematic view of the system employed in the present invention.

In FIG. 2, positioning of probe 20 over infrared photovoltaic detector tested 12' is accomplished by X-Y axis positioning means 30 and Z axis positioning means 32. Z axis positioning means is connected to electrical shield 24 and moves shield 24, preamplifier 22 and probe 20 at the same time. Z axis positioning means moves this shield assembly, electrical shield 24, probe 20 and preamplifier 22 along an axis perpendicular to the plane of the infrared detector array, and controls the spacing between probe 20 and individual contact 16' of infrared photovoltaic detector 12'. X-Y axis positioning means 30 moves substrate 14 and infrared photovoltaic detectors 12. Signal analyzer 40 measures the output signal from preamplifier 22. Common contact 18 of the infrared photovoltaic detectors is connected to variable voltage source 42. Radiation source 44 provides modulated infrared radiation at a known wavelength and known intensity to infrared photovoltaic detector 12'. Cooling means 46 provides a cooling gas to infrared photovoltaic detector 12' to maintain it at the desired temperature. Temperature sensor 48 is used to monitor the temperature inside temperature shield 50.

To coordinate the interaction of the various components of the system preferably a computer (not shown) is used. Preferably probe 20 of the present invention presents a surface area substantially similar to the surface area of the individual contact of the infrared photovoltaic detector. The probe must be shielded to eliminate signals from other infrared photovoltaic detectors.

Turning back to FIG. 1, good results for probe 20 have been obtained by using 0.002 inch (0.005 cm) diameter copper wire 60 that has been placed in glass capillary tube 62 that has been shielded by placing a layer of evaporated gold 64 thereon. Formation of the layer of evaporated gold 64 was accomplished in a conventional manner. As is seen in FIG. 1, tip 66 of wire 60 is flat. Flat tip 66 acts as one plate of the parallel plate capacitor formed between the probe 20 and contact 16'. Contact 16' forms the other plate. Flat tip 66 and contact 16' face each other with preferably substantially similar surface areas. The spacing between flat tip 66 and contact 16' is a distance "d". The spacing "d" is controlled by positioning means 30 and 32.

It is preferred that tip 66 be flat in order to provide the maximum capacitance for a given spacing "d". Preferably, the surface area of tip 66 is substantially similar to the surface area of individual contact 16', again to provide the maximum capacitance.

The distance "d" between tip 66 and contact 16' is as small as practical and preferably between about 0.25 micrometers to about 2 micrometers. Readings can be made at distances as much as 10 micrometers.

In order to form the capacitor, tip 66 and contact 16 may not touch. A limiting factor for the distance "d" between tip 66 and contact 16 is stray mechanical vibrations in the equipment itself. These stray mechanical vibrations are due to the mechanical equipment. It is apparent to one of skill in the art that stray vibrations must be minimized in order to allow probe 20 to be close to individual contact 16' without actually touching it.

Preamplifier 22 is in close proximity to probe 20. Preferably, preamplifier 22 is no more than 2 inches away, this distance being measured by wire distance. More preferably, the preamplifier is about 0.1 inches (0.254 cm) away. The preamplifier is most preferably part of an integrated circuit which includes probe 20 itself.

Suitable preamplifiers are field effect transistors with very low input current (less than $50 \times 10^{-14}$ amps at room temperature) and low input capacitance (1-2 picofarads). Good results have been obtained with a type U-423 manufactured by Siliconix that was connected about one inch away from the probe.

The connection between the probe and the preamplifier is conventional except that the gate of the preamplifier is connected to a resistor which in turn is connected to the common ground of the system.

Signal analysis 40 is conventional. Good results have been obtained with a standard oscilloscope and lock-in amplifier. Instead of a lock-in amplifier, a spectrum analyzer or network analyzer may also be used, depending on the details of the measurements to be made.

Electric shield 24 must shield both probe 20 and preamplifier 22. Preferably the shield extends to signal analyzer 40. Conventionally, the shield from the preamplifier 22 to signal analyzer 40 is a conventional coaxial cable.

Variable voltage source 42 is conventional. It is capable of varying both voltage and frequency. Source 42 is connected by common contact 18 of array substrate 14. A suitable source 42 is a function generator.

The means for aligning the infrared photovoltaic detector with the probe are conventional. Good results have been obtained with a Z axis positioner and X-Y axis positioner. These positioners are preferably of a micrometer arrangement which are driven by positioner motors. Good results have been obtained by manually positioning the probe and the infrared photovoltaic detector.

Radiation source 44 is conventional such as a black body source. The radiation is modulated by conventional techniques. Preferably, the radiation is directed onto the infrared photovoltaic detector from below as shown in FIG. 2.

Cooling gas 46 is an inert gas such as helium or nitrogen which maintains the infrared photovoltaic detector at appropriate temperature for measurement (in the case of mercury-cadmium-tellurium infrared photovoltaic detector, 77 Kelvin ($-200°$ C.).

Temperature shield 50 helps to maintain infrared photovoltaic detector 12' at the appropriate temperature. Shield 50 is conventional. Preferably, shield 50 has a temperature sensor mounted therein. This provides a means to monitor the temperature inside shield 50.

One of skill in the art realizes that this process is fully automatable or an operator can be used in place of the computer. Both arrangements are within the scope of this invention.

The preferred method for non-contact testing of the infrared photovoltaic detector 12 prior to dicing the infrared photovoltaic detector from a wafer is:

(a) positioning probe 20 a distance "d" away from photovoltaic detector contact 16' such that a capacitance is formed between the probe 20 and photovoltaic detector contact 16';

(b) subjecting the array of infrared photovoltaic detector 12 to the output of variable AC voltage generator 42;

(c) subjecting infrared photovoltaic detector 12' to known source 44 of modulated infrared radiation;

(d) amplifying the signal from probe 20 by the use of preamplifier 22; and (e) determining electrical and electro-optical properties of infrared photovoltaic detector 12' by analyzing the output of preamplifier 22.

Preferably, the spacing between probe 20 and contact 16' is controlled by the use of the signal from probe 20 by an active feedback loop which responds rapidly enough to reduce the effects of stray vibration.

Those skilled in the art of electrical circuit analysis will realize that it is possible to determine all of the electrical properties of the infrared photovoltaic detector under test, as well as the value of the probe to infrared photovoltaic detector capacitance by varying the output of the variable voltage source 42 and using standard analysis techniques in the signal analyzer 40. In addition, with the presence of modulated radiation from source 44, it is also possible to determine the electro-optical parameters of infrared photovoltaic detector 12.

The precision of the infrared photovoltaic detector parameter determination will be strongly affected by the probe to contact spacing "d"; in particular, more precise parameter determination is possible if "d" is smaller. This is due to the increase in probe to contact capacitance which occurs at smaller "d". The probe capacitance is therefore a relatively less important contributor to the total series impedance. The performance of the Z-axis position mechanism 32 is therefore important in the overall performance of the test system.

One infrared photovoltaic detector property that is highly desirable to measure is the excess (or 1/f) noise which appears at low frequencies with reverse bias voltage. Since this noise is essentially an instability of the infrared photovoltaic detector current-voltage characteristic which can be measured by the present invention, the excess infrared photovoltaic detector noise can also be determined by the present system.

Since the probe to infrared photovoltaic detector spacing is one of the major factors determining the accuracy of the system and therefore its usefulness, it is important to incorporate means for controlling this spacing as accurately as possible. The minimum usable spacing is normally limited by stray mechanical vibration of the system. In addition to the standard techniques of vibration isolation and rigid construction, the probe spacing can be controlled by an active feedback loop wherein the output of the signal analyzer (a signal proportional to the probe capacitance and inversely proportional to the probe spacing) is used as the error signal. The error signal is then used to control the probe position through a feedback loop which responds quickly enough for the probe to follow the vibration of the infrared photovoltaic detector array. A much smaller usable minimum spacing will result. Such a feedback loop is preferably implemented with a specialized electronic circuit using standard techniques well-known to those skilled in the art.

While there has been shown and described a preferred embodiment of the invention, those skilled in the art will appreciate that various changes and modifications may be made to the illustrated embodiment without departing from the true spirit and scope of the invention which is to be determined from the appended claims.

The embodiments of the invention in which an exclusive property or right is claimed are defined as follows:

1. A method for non-contact testing of an infrared photovoltaic detector prior to dicing the infrared photovoltaic detector from a wafer comprising the steps of:
    (a) forming a capacitance with a probe and an individual contact of said infrared photovoltaic detector;
    (b) subjecting said infrared photovoltaic detector to known variable AC voltage;
    (c) subjecting said photovoltaic detector to known modulated infrared radiation;
    (d) amplifying a signal from said probe by the use of a suitable preamplifier; and
    (e) determining electrical and electro-optical properties of the said photovoltaic detector by analyzing the output of the said preamplifier.

2. The method of claim 1 wherein the probe to photovoltaic detector spacing is controlled by the use of the signal from the probe.

3. A system for non-contact testing of an infrared photovoltaic detector prior to dicing the infrared photovoltaic detector from the wafer, said infrared photovoltaic detector having an individual contact and a common contact comprising:
    (a) a probe positioned a distance "d" from the infrared photovoltaic detector contact such that a capacitance is formed between the probe and the individual contact;
    (b) a means for generating modulated infrared radiation which is incident upon the infrared photovoltaic detector;
    (c) a preamplifier connected to the probe for amplifying a signal from the probe;
    (d) a means for applying a known AC voltage to the common contact;
    (e) means for maintaining the infrared photovoltaic detector at appropriate temperature during measurements; and
    (f) means for analyzing signals from the preamplifier.

4. The system of claim 3 further comprising a means for moving said probe.

5. The system of claim 4 wherein "d" is about 0.5-1 micron.

6. The system of claim 3 wherein said probe has a surface area substantially similar to the surface area of said individual contact.

* * * * *